Figure 1:
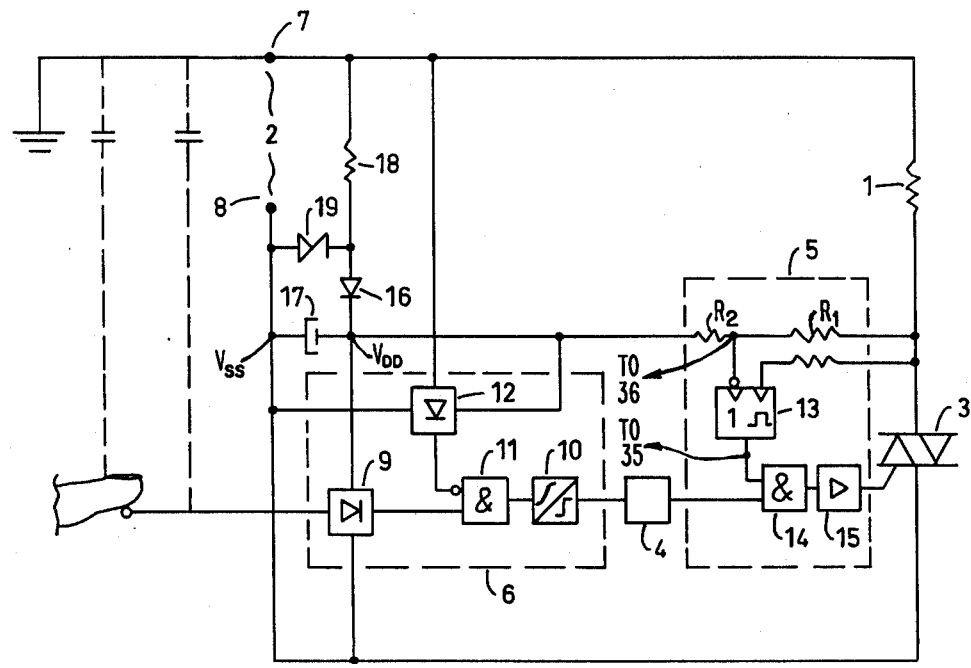

United States Patent [19]

Wern

[11] 4,210,822
[45] Jul. 1, 1980

[54] TOUCH CONTROL SWITCH

[76] Inventor: Lars A. Wern, Upplandsgatan 65, 113 28 Stockholm, Sweden

[21] Appl. No.: 885,806

[22] Filed: Mar. 13, 1978

[30] Foreign Application Priority Data

Aug. 5, 1977 [SE] Sweden ............................... 7708952

[51] Int. Cl.² .......................................... H03K 17/68
[52] U.S. Cl. ..................................... 307/116; 307/157
[58] Field of Search ................... 307/252 H, 116, 157; 328/5; 340/332, 565; 315/362

[56] References Cited

U.S. PATENT DOCUMENTS

| 3,811,054 | 5/1974 | Wern | 340/332 X |
| 4,159,473 | 6/1979 | Senk | 307/116 X |

Primary Examiner—L. T. Hix
Assistant Examiner—James L. Dwyer
Attorney, Agent, or Firm—Hubbell, Cohen, Stiefel & Gross

[57] ABSTRACT

A touch control switch suitable for connection between a lamp load and a supply circuit in a lighting installation for alternating current and comprising a semiconductor switching element with a gate electrode, a counting circuit with a forward stepping input and a digital control output connected to the gate electrode of the semiconductor switching element via a trigger pulse generating circuit for controlling the conduction of the semiconductor switching element in dependence on the condition of activation of the digital control output, and a control pulse shaping circuit having an output connected to the forward stepping input of the counting circuit and a first and second input terminal for connection to a first and second, respectively terminal of the supply circuit via a touch sensitive impedance. The trigger pulse generating circuit comprises an edge-triggered mono-pulse generating circuit that has a first input for leading edge triggering and a second input for trailing edge triggering jointly connected to the supply circuit.

3 Claims, 2 Drawing Figures

TOUCH CONTROL SWITCH

The invention relates to a touch control switch suitable for connection between a lamp load and a supply circuit in a lighting installation for alternating current and comprising a semiconductor switching element with a gate electrode, a counting circuit with a forward stepping input and a digital control output connected to the gate electrode of the semiconductor switching element via a trigger pulse generating circuit for controlling the conduction of the semiconductor switching element in dependence on the condition of activation of the digital control output, and a control pulse shapping circuit having an output connected to the forward stepping input of the counting circuit and a first and second input terminal for connection to a first and second, respectively terminal of the supply circuit via a touch sensitive impedance.

A touch control switch of the type defined above is described in the U.S. Pat. No. 3,811,054. A large scale use of that touch control switch is complicated thereby that it has a high non-load power dissipation, that it cannot cope with reactive loads such as fluorescent lamps, and that many of its components are not possible to integrate in a monolithic form.

The touch control switch according to the invention has a very low non-load power dissipation. It can cope with reactive loads and is possible to integrate in a monolithic form with the exception of only a few components.

Figure 2:
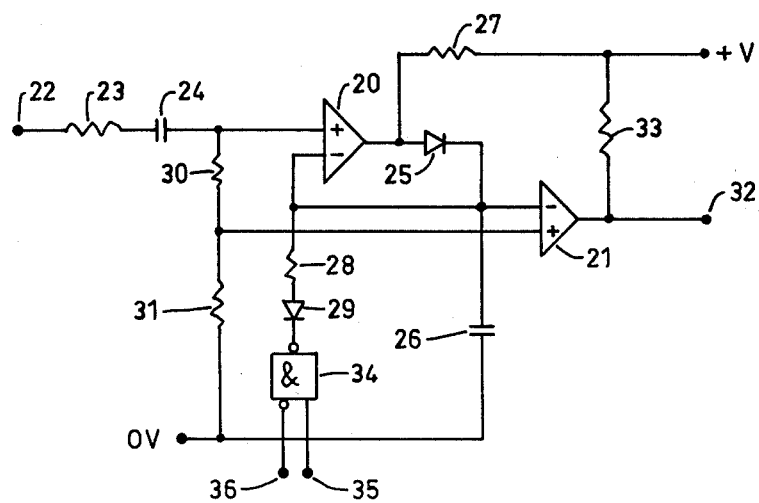

The invention, the characteristics of which appear from the appended claims, will now be explained more in detail with reference made to the accompanying drawing wherein FIG. 1 is a block diagram of a preferred embodiment of the touch control switch according to the invention and FIG. 2 is a circuit diagram of a touch detecting clipper stage included in the block diagram in FIG. 1.

FIG. 1 shows a touch control switch; the principal function of which is with the exception of the improvements according to the invention to be described below explained in detail in the U.S. Pat. No. 3,811,054 and which is interconnected between a lamp load 1 and a supply circuit 2 in a lighting installation for alternating current and comprises a semiconductor switching element 3 with a gate electrode. The touch control switch comprises further a counting circuit 4 with a forward stepping input and a digital control output connected to the gate electrode of the semiconductor switching element 3 via a trigger pulse generating circuit 5 for controlling the conduction of the semiconductor switching element 3 in dependence on the condition of activation of the digital control output, and a control pulse shaping circuit 6 having an output connected to the forward stepping input of the counting circuit 4 and a first and second input terminal with a connection to a first terminal 7 and to a second terminal 8, respectively of the supply circuit 2 via a touch sensitive external capacitive reactance.

The control pulse shaping circuit 6 comprises a touch detecting clipper stage 9 in which, as it will be described later on in connection with FIG. 2, a peak value detector and an adding circuit are included with a respective input connected to the input of the control pulse shaping circuit 6, a second input of the adding circuit being connected to the output of the peak value detector.

The output of the control pulse shaping circuit 6 is connected to the output of the clipper stage 9 via a pulse counting circuit 10 and an AND-circuit 11 with an inhibiting input connected to the supply circuit 2 via a second slipper stage 12 given the same internal structure as the clipper stage 9 and having the purpose to inhibit a malfunction caused by false control pulses occurring as a consequence of a voltage rise on the supply circuit 2 upon, for example, a disconnection of electric ovens.

In the preferred embodiment of the invention, the touch control switch has the trigger pulse generating circuit 5 arranged to comprise a mono-stable flip-flop 13 with a first input for leading edge triggering and a second input for trailing edge triggering jointly connected to the supply circuit 2 in shunt with the semiconductor switching element 3 and in series with the lamp load 1 in order to be controlled by the current through the latter that can be an incandescent lamp or a fluorescent lamp with a phase compensating capacitor. The connecttion of the trailing edge triggering input of the mono-stable flip-flop 13 to the supply circuit 2 is arranged via a resistive voltage divider in which a shunt link is connected to a biasing potential in order to provide a symmetrical triggering for the positive and negative half periods of the alternating current through the lamp load 1. According to the example, the mono-stable flip-flop is of the C-MOS type, the biasing potential is the supply voltage $V_{DD}$ of the flip-flop and the resistance of the shunt link is substantially half the value of the resistance of the series link in the voltage divider.

The trigger pulse generating circuit 5 comprises further an AND-circuit 14 that has a first input connected to the output of the monostable flip-flop 13 and a second input connected to the digital control output of the counting circuit 4 and that has an output connected to the gate electrode of the semiconductor element 3 via a driver stage 15. The latter supplies a trigger pulse when a predetermined voltage has been built up over the semiconductor element 3 that according to the example is a TRIAC. The duration of the trigger pulse can be very short as compared with the duration of the half period of the alternating current, for example 100 $\mu$s and 10 ms, respectively, implying that the non-load power dissipation of the touch control switch can be brought down to a very low value since the demand on its supply of current to the control circuitry pertaining to the semiconductor element 3 will be modest.

The supply of current to the control circuitry in the touch control switch is, according to the example, arranged via a rectifier diode 16, a smoothing capacitor 17, a voltage dropping resistor 18 for the connection to the supply circuit 2 and a voltage limiting zener diode 19. The non-load power dissipation of the touch control switch is substantially equal to the power dissipation of the voltage dropping resistor 18 and can in the preferred embodiment of the invention be kept below $\frac{1}{2}$ watt at 240 VAC and driving a TRIAC capable of supplying 2.5 A.

FIG. 2 is a circuit diagram of the clipper stage 9 in FIG. 1 in an embodiment suited for a monolithic integration together with the above described trigger pulse generating circuit 5 and the majority of the other elements of the touch control switch. Two voltage comparators 20 and 21 have a respective signal input jointly connected to a control input 22 of the clipper stage 9 via a protection circuit consisting of a resistor 23 and a capacitor 24. They have further a respective reference input jointly connected to the output of the one comparator 20 via a peak value detector consisting of a rectifier diode 25, a capacitor 26, a charge resistor 27 and a discharge resistor 28 keyed by a switching diode 29 as it will be explained more in detail below, the connection of the signal input of the other comparator 21 to the control input 22 being arranged via a resistive voltage divider consisting of a series resistor 30 and a shunt resistor 31. The voltage comparator 21 constitutes the above-mentioned adding circuit and has an output 32 with a current-feeding resistor 33 connected to the output of the clipper stage.

The sensitivity of the touch detecting clipper stage 9 is inversely proportional to the attenuation in the above-mentioned resistive voltage divider which can with a maintained margin to a generation of flase control pulses be reduced in an inverse proportion to an increase of the time constants for charge and discharge in the above-mentioned peak value detector. In the latter, the charge time constant must in any case be considerably greater than the period time of the alternating current in the supply circuit 2. The resistance of the discharge resistor 28 can, however, be considerably smaller than the resistance of the charge resistor 27 thanks to the fact that the former resistor 28 is keyed by the switching diode 29 that is arranged to conduct only during a very short time interval of the period of the alternating current in the supply circuit 2 corresponding to the duration of the trigger pulse for the negative half period applied to the semiconductor element 3. This is accomplished thereby that the switching diode 29 is connected to the output of an AND-circuit 34 which has a signal input 35 arranged to be connected to the output of the monostable flip-flop 13 in FIG. 1 and an inhibiting input 36 arranged to be connected to the trailing edge triggering input of the flip-flop 13.

The circuit structure of the clipper stage in FIG. 2 can be modified thereby that the rectifier diode 25 and the switching diode 29 are replaced by analog MOS-gates with low leakage currents. In addition, the series resistor 30 can possibly be replaced by a direct wire connection and a negative biasing of the signal input of the voltage comparator 21 relatively its reference input.

The function of the clipper stage in FIG. 2 corresponds to the function of a clipper stage described in the above-mentioned U.S. Pat. No. 3,811,054 but works with a lower signal voltage and with larger tolerances in the circuit resistors, which makes it suited for a monolithic integration. It is essential that variations in the external capacitance on the input of the touch detecting clipper stage 9 influences the phase position of the control pulses supplied from this only to a small extent in order to insure a correct signal processing in the AND-circuit 11 and in the pulse counting stage 10. This is accomplished by selecting the resistance of all the resistors 23, 30 and 31 considerably lower than the reactance of the capacitor 24 the capacitance of which in its turn is selected substantially equal to the maximum external capacitance, according to the example 500 pF. In addition, the input of the clipper stage 9 can be provided with a shunt circuit with a variable attenuation produced, for example, by means of a field effect transistor controlled by the voltage over the capacitor 26 of the peak value detector in a known manner described in Electronics, Vol. 50, No. 7, pp. 107. A constant ratio between a varying external series reactance and a shunt resistance varying proportionally thereto in the input circuitry of the clipper stage is then obtained and results in that the phase position of the control pulses supplied from this is maintained constant relatively the phase of the alternating current in the supply current 2 which makes it possible for the AND-circuit 11 and the clipper stage 12 to increase the margin in inhibiting false control pulses produced as a consequence of voltage transients in the supply circuit 2.

I claim:

1. Touch control switch suitable for connection between a lamp load and a supply circuit in a lighting installation for alternating current and comprising a semiconductor switching element with a gate electrode, a counting circuit with a forward stepping input and a digital control output connected to the gate electrode of the semiconductor switching element via a trigger pulse generating circuit for controlling the conduction of the semiconductor switching element in dependence on the condition of activation of the digital control output, and a control pulse shaping circuit having an output connected to the forward stepping input of the counting circuit and a first and second input terminal for connection to a first and second, respectively terminal of the supply circuit via a touch sensitive impedance, characterized in that the trigger pulse generating circuit comprises an edge-triggered mono-pulse generating circuit that has a first input for leading edge triggering and a second input for trailing edge triggering jointly connected to the supply circuit.

2. Touch control switch according to claim 1, characterized in that said joint connection to the supply circuit of the inputs of the mono-pulse generating circuit is arranged in shunt with the semiconductor switching element and in series with the lamp load.

3. Touch control switch according to claim 1, characterized in that the mono-pulse generating circuit is a mono-stable flipflop of the C-MOS type, that the connection of its second input for trailing edge triggering to the supply circuit is arranged via a resistive voltage divider in which a shunt link is connected to the supply voltage $V_{DD}$ of the flipflop, and that the resistance of the shunt link is substantially half the value of the resistance of the series link in the voltage divider in order to provide a symmetrical triggering for the positive and negative half periods of the alternating current.

* * * * *